(12) United States Patent
Jones

(10) Patent No.: US 7,240,248 B2
(45) Date of Patent: Jul. 3, 2007

(54) APPARATUS AND METHOD FOR REDUCING FALSE TRIGGERING OF A SIGNAL DUE TO AN ELECTROSTATIC DISCHARGE EVENT

(75) Inventor: Leroy Jones, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 519 days.

(21) Appl. No.: 10/705,538

(22) Filed: Nov. 10, 2003

(65) Prior Publication Data

US 2005/0102588 A1    May 12, 2005

(51) Int. Cl.
*G11B 20/20* (2006.01)
(52) U.S. Cl. ............... 714/700; 714/815; 714/799; 714/798; 714/55
(58) Field of Classification Search .......... 714/815, 714/799, 798, 55, 700; 361/56, 90
See application file for complete search history.

(56) References Cited

U.S. PATENT DOCUMENTS

| | | | |
|---|---|---|---|
| 5,895,959 A | 4/1999 | Chang | 257/360 |
| 5,901,022 A | 5/1999 | Ker | 361/56 |
| 6,577,480 B1 | 6/2003 | Avery et al. | 361/56 |
| 6,744,291 B2 * | 6/2004 | Payne et al. | 327/143 |
| 6,765,771 B2 * | 7/2004 | Ker et al. | 361/56 |
| 6,819,539 B1 * | 11/2004 | Wright et al. | 361/90 |
| 6,862,161 B2 * | 3/2005 | Woo | 361/56 |

* cited by examiner

*Primary Examiner*—Albert Decady
*Assistant Examiner*—Esaw Abraham
(74) *Attorney, Agent, or Firm*—Baker Botts L.L.P.

(57) ABSTRACT

An apparatus and method for reducing false triggering of a signal due to an electrostatic discharge event are disclosed. The method includes detecting a high voltage on a signal received at an input of a delay circuit and delaying the signal between the input of the delay circuit and an output of the delay circuit for a predetermined amount of time. If a low voltage is detected on the signal after the predetermined amount of time, the high voltage is prevented from propagating to the output of the delay circuit.

21 Claims, 1 Drawing Sheet

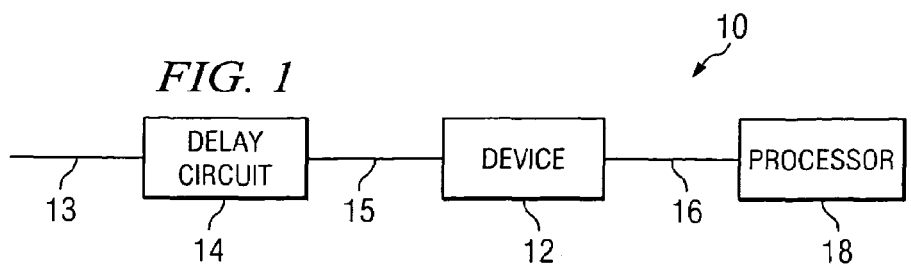
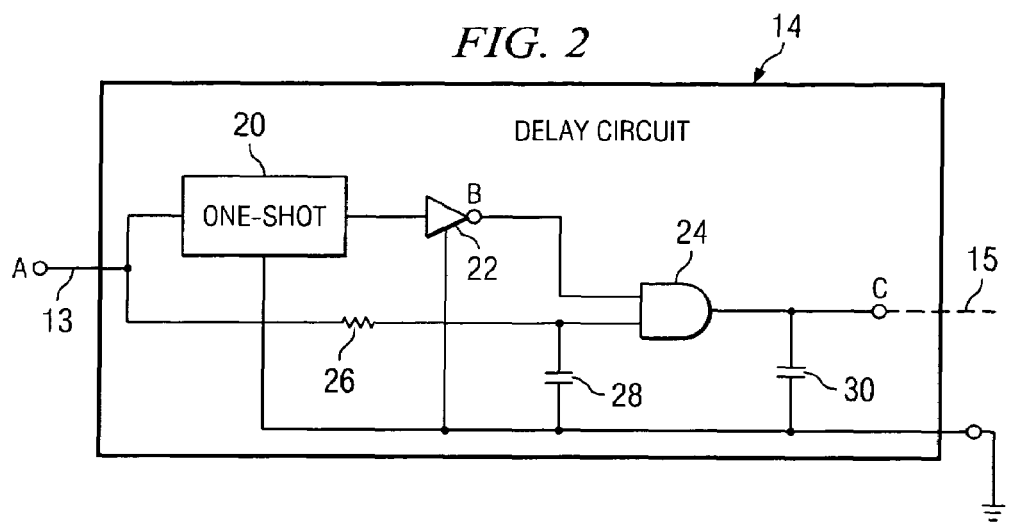
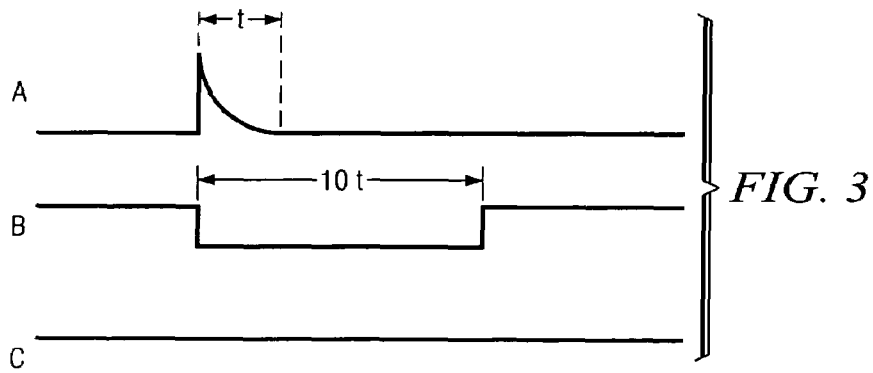
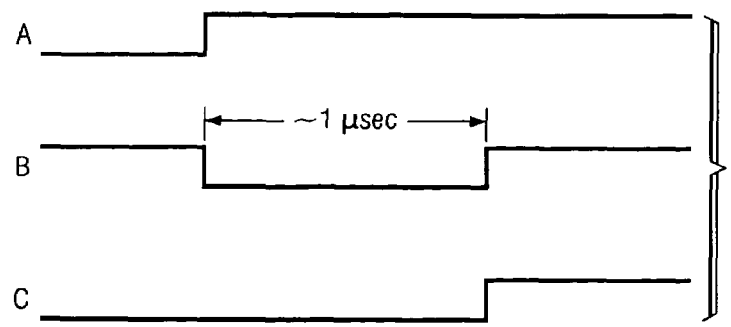

APPARATUS AND METHOD FOR REDUCING FALSE TRIGGERING OF A SIGNAL DUE TO AN ELECTROSTATIC DISCHARGE EVENT

TECHNICAL FIELD

The present disclosure relates in general to an information handling system, and more particularly to an apparatus and method for reducing false triggering of a signal due to an electrostatic discharge event.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

An information handling system may include various signals that control specific functions in the system. Some of these signals may be edge triggered signals that, once activated, remain activated until the information handling system is reset. One example of an edge triggered signal is a control signal that causes the information handling system to power off when an error in the system is detected. If the control signal is triggered, the information handling system is powered off so that the cause of the problem may be diagnosed. The control signal is then reset when the information system is powered on.

During operation of the information handling system, electrostatic discharge (ESD) events (e.g., a user walks across a carpet, generates a static charge and then touches the system) may cause false errors to occur. The ESD events may cause a voltage spike on one or more of the signals in the information handling system. If the affected signal is an edge triggered signal, the ESD event may falsely activate the signal, and in some cases, may cause the system to power down even though there is no actual error in the system.

Previous solutions for preventing ESD events from falsely activating signals in an information handling system have included adding a shunt from the signal to ground or adding an RC circuit to the signal. These solutions were effective for information handling systems having a higher core voltage (e.g., approximately 5 volts). Core voltages in current systems, however, are being reduced (e.g., to approximately 3.3 volts, 1.8 volts and below) and the previous solutions are becoming less effective for preventing a voltage spike from falsely triggering a signal.

SUMMARY

In accordance with the present invention, the disadvantages and problems associated with reducing false triggering of a signal due to electrostatic discharge (ESD) events have been substantially reduced or eliminated. In a particular embodiment, an information handling system is disclosed that prevents a high voltage from propagating to an output of a delay circuit if a low voltage is detected at an input of the delay circuit after a predetermined amount of time.

In accordance with one embodiment of the present invention, a method for reducing false triggering of a signal in an information handling system includes detecting a high voltage on a signal received at an input of a delay circuit and delaying the signal between the input of the delay circuit and an output of the delay circuit for a predetermined amount of time. If a low voltage is detected on the signal after the predetermined amount of time, the high voltage is prevented from propagating to the output of the delay circuit.

In accordance with another embodiment of the present invention, an information handling system includes a device including a control input coupled to a delay circuit including an input and an output. The delay circuit operates to delay a signal received at the input of the delay circuit for a predetermined amount of time and to prevent a high voltage from propagating to the output of the delay circuit if the delay circuit detects a low voltage on the signal after the predetermined amount of time.

In accordance with a further embodiment of the present invention, a device includes a delay circuit coupled to a control input. The delay circuit operates to delay a signal received at the control input for a predetermined amount of time and to prevent a high voltage from propagating to an output of the delay circuit if the delay circuit detects a low voltage on the signal after the predetermined amount of time.

Important technical advantages provided by certain embodiments of the present disclosure include a delay circuit that reduces the number of false errors in an information handling system. The delay circuit detects a high voltage on a signal received at the input of the circuit and suppresses the signal for a predetermined amount of time. If the high voltage was created by an ESD event, the delay circuit prevents the high voltage from falsely activating the signal by providing a delay to the signal that allows the signal received at the input time out before the signal is accepted as a valid input.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein:

FIG. 1 illustrates a block diagram of an information handling system that includes a delay circuit that reduces false triggering of a signal due to electrostatic discharge (ESD) events in accordance with teachings of the present invention;

FIG. 2 illustrates a circuit diagram of a delay circuit that reduces false triggering of a signal due to ESD events in accordance with teachings of the present invention;

FIG. 3 illustrates a timing diagram for a signal received by a delay circuit when an ESD event occurs in accordance with teachings of the present invention; and FIG. 4 illustrates a timing diagram for a signal received by a delay circuit when a valid high voltage occurs on the signal in accordance with teachings of the present invention.

DETAILED DESCRIPTION

Preferred embodiments and their advantages are best understood by reference to FIGS. 1 through 4, wherein like numbers are used to indicate like and corresponding parts. In particular, the present disclosure concerns an apparatus and method for reducing false triggering of a signal due to an electrostatics discharge (ESD) event. During operation of the information handling system, an ESD event may occur. The ESD event may create a voltage spike (e.g., a high voltage is present for a short period of time) on some of the signals in the information handling system. These voltage spikes may falsely activate one or more signals that cause the information handling system to be powered off. The information handling system provided by the present disclosure includes a delay circuit that delays a signal in order to prevent the signal from being falsely triggered by an ESD event. If the delay circuit detects a high voltage on a signal received at an input of the delay circuit, the signal is delayed between the input and the output of the delay circuit for a predetermined amount of time. The delay circuit then prevents the high voltage from propagating to the output if a low voltage is detected at the input after the predetermined amount of time.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, read only memory (ROM), and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring to FIG. 1, a block diagram of an information handling system including a delay circuit that delays a signal for a specific amount of time is shown. Information handling system 10 includes device 12, delay circuit 14, local bus 16 and processor 18. In one embodiment, local bus 16 may be a peripheral component interconnect (PCI) bus or PCI-X bus for coupling device 12 to other components, such as processor 18, of information handling system 10 and communicating data and control signals to the components. In other embodiments, local bus 16 may be an Industrial Standard Architecture (ISA) bus, a Personal Computer Memory Card International Association (PCMCIA) interface, or any other suitable technology that provides input/output capability to information handling system 10. Processor 18 may be a microprocessor, a microcontroller, a digital signal processor (DSP) or any other digital circuitry configured to communicate control and data signals to and from other components coupled to local bus 16.

Device 12 may be any device that provides additional functionality to information handling system 10. In one embodiment, device 12 may be an interface control hub. In other embodiments, device 12 may be, but is not limited to, a PCI or PCI-X device, a network interface device, a modem, a graphic device, a sound device and a mass storage interface device (e.g., Small Computer System Interfaces (SCSI) or Integrated Drive Electronics (IDE) interfaces) for floppy and hard disk drives, tape drives, CD-ROM drives, or DVDs. Although device 12 is illustrated as being directly interfaced with local bus 16, device 12 may be a peripheral device inserted in an expansion slot located on a motherboard or a riser card that is interfaced directly with local bus 16.

In the illustrated embodiment, delay circuit 14 is separate from device 12 and may be located on the motherboard (not expressly shown), a riser card or any other circuit board included in information handling system 10. In another embodiment, delay circuit 14 may be integral to device 12 such that the input of delay circuit 14 is connected to a control input of device 12. Delay circuit 14 functions to add a delay to signal received at input 13 of delay circuit 14 such that the signal is suppressed at output 15 of delay circuit 14 for a predetermined amount of time.

During operation of information handling system 10, an ESD event may occur and create voltage spikes on some of the signals in system 10. For example, an ESD event may occur due to a surge in the electrical current being supplied to information handling system 10 and/or a user may touch information handling system 10 after walking across a carpet. In either case, a static charge may be generated in information handling system 10 that increases the voltage on various signals. In one embodiment, the signals may be edge triggered control signals, which once activated (e.g., the signals switch from a low voltage level to a high voltage level) remain activated until a reset condition occurs. Example signals may include, but are not limited to, "Therm Trip," which indicates that the temperature of processor 18 is above a threshold level, "Overvoltage," which indicates that the core voltage has increased above a specified level, and "Powergood," which indicates that the power supply (not expressly shown) for information handling system 10 has stabilized during a boot sequence. Some of these example signals, if activated, may cause information handling system 10 to power off. If the ESD event causes a voltage spike having a duration long enough to activate any of the edge triggered control signals, information handling system 10 may be powered down even though there are no actual errors in system 10.

Delay circuit 14 operates to prevent ESD events from falsely triggering any edge triggered control signals by adding a delay to the signals. In the illustrated embodiment, delay circuit 14 adds a delay for a predetermined amount of time to a signal between input 13 and output 15. If an ESD event occurs, a high voltage may be received at input 13 for a given length of time. Delay circuit 14 suppresses the signal at output 15 for a predetermined amount of time, which is greater than the length of time that the high voltage is present on input 13. Delay circuit, therefore may prevent the voltage spike caused by the ESD event from propagating to output 15 and ultimately prevents the signal from being falsely activated. If a valid signal indicating that, for example, information handling system 10 should be powered off is received at input 13, the high voltage may be present at input 13 after the delay generated by delay circuit 14. In this case, the appropriate control signal may be properly activated indicating that an error occurred in information handling system 10.

FIG. 2 illustrates a circuit diagram of delay circuit 14. Delay circuit 14 may include one-shot 20, inverter 22, AND gate 24, resistor 26, and capacitors 28 and 30. As illustrated, input A, which corresponds to input 13 of FIG. 1, is connected to the input of one-shot 20 and resistor 26. The output of one-shot 20 is connected to inverter 22 and inverter 22 is connected to the first input of AND gate 24. Resistor 26 is connected to the second input of AND gate 24 and to capacitor 28. Resistor 26 and capacitor 28 form an RC circuit that provides a time constant to the signal received at input A such that a race condition is not created between the two inputs of AND gate 24. In one embodiment, resistor 26 may be a fixed value resistor. In another embodiment, resistor 26 may be a variable resistor such that the value of resistor 26 may be changed to adjust the time constant associated with the RC circuit formed by resistor 26 and capacitor 28.

One-shot 20 may be any monostable circuit that produces a single pulse of a fixed duration each time that one-shot 20 is triggered. The duration of the pulse may be determined by the following formula:

$$T_{high} = (1.1)RC$$

where $T_{high}$ is the time that the pulse remains high (e.g., a logic "1"), R is the value of a resistor (not expressly shown) included in one-shot 20 and C is the value of a capacitor (not expressly shown) included in one-shot 20. In one embodiment, one-shot 20 may be programmable and the duration of the pulse may be adjusted by changing the values of the resistor (R) and the capacitor (C).

During operation of information handling system 10, a high voltage (e.g., a logic "1") may be detected at input A of delay circuit 14. In one embodiment, the high voltage may be a voltage spike caused by an ESD event. In another embodiment, the high voltage may be a valid signal, such as a control signal that causes information handling system 10 to power off when the signal is activated. As described in more detail with respect to FIG. 3, the high voltage triggers the pulse generated by one-shot 20. During the time period that the pulse is activated (e.g., the pulse has a high voltage level representing a logic "1"), the combination of one-shot 20, inverter 22 and AND gate 24 prevents the signal from propagating to output C. When the pulse is deactivated (e.g., the pulse has a low voltage level representing a logic "0"), the signal present at input A propagates to output C. When the high voltage is caused by an ESD event, the delay associated with the pulse generated by one-shot 20 will be longer than the duration of the ESD event, and a low voltage will be present after the predetermined amount of time. Thus, the voltage spike created by the ESD event will not propagate to output C. Delay circuit 14, therefore, prevents the signal from being falsely activated by an ESD event. When the high voltage is a valid signal, the high voltage is present at input A after the delay associated with the pulse. The valid signal then propagates to output C, and properly triggers the signal.

FIG. 3 illustrates a timing diagram of a signal received on input A of delay circuit 14 during an ESD event. Referring to FIG. 2, input A is the input of delay circuit 14, output B is the output of inverter 22 and output C is the output of delay circuit 14. As shown in FIG. 3, input A initially has a voltage level that represents a logic "0", output B has a voltage level that represents a logic "1" and output C has a voltage level that represents a logic "0". In one embodiment, the signal received at input A may be an edge triggered control signal that, when activated (e.g., the signal has a high voltage level representing a logic "1"), causes information handling system 10 to power off.

Table 1 illustrates a truth table for delay circuit 14 based on the voltage levels present at input A and output B. In the embodiment illustrated in FIG. 2, output B has the inverse voltage level of the output of one-shot 20. For example, one-shot 20 may generate a pulse having a high voltage level (e.g., a logic "1") and output B may have a low voltage level (e.g., a logic "0") when the pulse is generated.

TABLE 1

| Input A | Output B | Output C |
|---------|----------|----------|
| 0 | 0 | 0 |
| 0 | 1 | 0 |
| 1 | 0 | 0 |
| 1 | 1 | 1 |

During operation of information handling system 10, a high voltage, such as a voltage spike caused by an ESD event, may be detected on input A. The high voltage may activate the pulse generated by one-shot 20, which causes output B to change from a logic "1" to a logic "0". During the predetermined amount of time that the pulse is activated, any voltage change that occurs on the signal received at input A does not propagate to output C. In order to prevent the ESD event from activating the signal at output C, the delay should be longer than the duration of the ESD event. In one embodiment, the duration (t) of the ESD event may be approximately 100 nanoseconds (ns) and the duration of the pulse (e.g., the delay added to the signal between input A and output C) may be approximately ten times the duration (t) of the ESD event. In other embodiments, the delay created by the pulse may be any multiple of the duration (t) of the ESD event such that a voltage spike generated by the ESD event is prevented from propagating to output C during the delay. As described above in reference to FIG. 2, one-shot 20 may be programmable such that the duration of the pulse may be modified.

After a predetermined amount of time, the pulse is deactivated and output B changes back to its original state (e.g., a logic "1"). Since the signal received at input A after the pulse generated by one-shot 20 is deactivated has a low voltage (e.g., a logic "0"), output C remains at a low voltage level. The delay generated by one-shot 20, therefore, may prevent the high voltage produced by the ESD event from propagating to output C and falsely triggering the control signal to shut down information handling system 10.

FIG. 4 illustrates a timing diagram of a valid signal received on input A of delay circuit 14. As described above in reference to FIG. 3, input A is the input of delay circuit 14, output B is the output of inverter 22 and output C is the output of delay circuit 14. As shown in FIG. 4, input A initially has a voltage level that represents a logic "0", output B has a voltage level that represents a logic "1" and output C has a voltage level that represents a logic "0."

During operation of information handling system 10, a high voltage associated with a valid signal may be detected on input A. The high voltage may activate the pulse generated by one-shot 20, which causes output B to change from a logic "1" to a logic "0". Again, during the predetermined amount of time that the pulse is activated, any voltage change that occurs on the signal received at input A does not propagate to output C.

After a predetermined amount of time, the pulse is deactivated and output B changes back to its original state (e.g., a logic "1"). Since the signal received at input A has an high voltage after the pulse generated by one-shot 20 is deactivated, the high voltage from input A propagates to output C and output C switches to a logic "1". In this embodiment, the delay does not effect the voltage level of the signal but merely adds a delay to the signal in order to verify that the signal received at input A is a valid signal.

Although the disclosed embodiments have been described in detail, it should be understood that various changes, substitutions and alterations can be made to the embodiments without departing from their spirit and scope.

What is claimed is:

1. A method for reducing false triggering of a signal in an information handling system, comprising:
   detecting a high voltage on a signal received at an input of a delay circuit;
   delaying the signal between the input of the delay circuit and an output of the delay circuit for a predetermined amount of time; and
   preventing the high voltage from propagating to the output of the delay circuit and preventing the signal from being falsely activated if the high voltage does not exist at the input after the predetermined amount of time.

2. The method of claim 1, further comprising applying the high voltage at the output of the delay circuit if the high voltage exist on the signal after the predetermined amount of time.

3. The method of claim 1, further comprising the high voltage generated by an electrostatic discharge event.

4. The method of claim 1, further comprising the delay circuit configured to interface with a device in an information handling system.

5. The method of claim 1, wherein the signal comprises an edge triggered control signal.

6. The method of claim 1, further comprising the delay circuit including a one-shot configured to generate a pulse for the predetermined amount of time.

7. The method of claim 1, wherein the predetermined amount of time comprises approximately one microsecond.

8. An information handling system, comprising:
   a device including a control input; and
   a delay circuit including an input and an output operably coupled to the control input of the device;
   the delay circuit configured to delay a signal received at the input of the delay circuit for a predetermined amount of time and prevent a high voltage from propagating to the output of the delay circuit and preventing the signal from being falsely activated if the high voltage does not exist at the input after the predetermined amount of time.

9. The system of claim 8, further comprising the delay circuit configured to apply the high voltage at the output of the delay circuit if the high voltage exists on the signal after the predetermined amount of time.

10. The system of claim 8, further comprising the high voltage generated by an electrostatic discharge (ESD) event.

11. The system of claim 10, wherein the predetermined amount of time comprises approximately ten times a length of the ESD event.

12. The system of claim 8, wherein the delay circuit comprises a one-shot circuit configured to generate a pulse for the predetermined amount of time.

13. The system of claim 12, further comprising the one-shot circuit configured to be programmed in order to vary the predetermined amount of time.

14. The system of claim 8, wherein the signal comprises an edge triggered signal configured to power off the information handling system.

15. The system of claim 8, wherein the device comprises an interface control hub.

16. A device, comprising:
    a control input; and
    a delay circuit operably coupled to the control input, the delay circuit including an output;
    the delay circuit configured to delay a signal received at the control input for a predetermined amount of time and prevent a high voltage from propagating to the output and preventing the signal from being falsely activated if the high voltage does not exist at the input after the predetermined amount of time.

17. The device of claim 16, further comprising the delay circuit configured to apply the high voltage at the output if the high voltage exists on the signal after the predetermined amount of time.

18. The device of claim 16, further comprising the high voltage generated by an electrostatic discharge (ESD) event.

19. The device of claim 16, further comprising the predetermined amount of time greater than a length of the ESD event by approximately ten times.

20. The device of claim 16, wherein the delay circuit comprises a one-shot circuit configured to generate a pulse for the predetermined amount of time.

21. The device of claim 16, wherein the signal comprises an edge triggered signal configured to power off an information handling system.

* * * * *